United States Patent [19]

Pétroff et al.

[11] 3,962,716
[45] June 8, 1976

[54] REDUCTION OF DISLOCATIONS IN MULTILAYER STRUCTURES OF ZINC-BLEND MATERIALS

[75] Inventors: Pierre Marc Pétroff, Westfield; George Arthur Rozgonyi, Chatham, both of N.J.

[73] Assignee: Bell Telephone Laboratories, Incorporated, Murray Hill, N.J.

[22] Filed: Apr. 25, 1974

[21] Appl. No.: 463,870

Related U.S. Application Data

[63] Continuation-in-part of Ser. No. 414,674, Nov. 12, 1973, abandoned.

[52] U.S. Cl. .................................. 357/18; 357/16; 357/61
[51] Int. Cl.² ............... H01S 33/19; H01L 29/161; H01L 29/205
[58] Field of Search .................. 357/17, 18, 16, 61; 331/94.5 M

[56] References Cited
UNITED STATES PATENTS

| | | | |
|---|---|---|---|
| 3,812,516 | 5/1974 | Hayashi | 317/235 R |
| 3,838,359 | 9/1974 | Hokki | 331/94.5 M |

OTHER PUBLICATIONS
Shih et al., *I.B.M. Tech. Discl. Bull.*, vol. 11, No. 12, May 1969, p. 1634.

Burnham et al., *Physics Letters*, Nov. 15, 1970, vol. 17, No. 10, pp. 455–456.

*Primary Examiner*—Martin H. Edlow
*Attorney, Agent, or Firm*—M. J. Urbano

[57] ABSTRACT

Described is a procedure for virtually eliminating disclocations in multilayer structures of materials having a crystallographic zinc-blend structure, in particular quaternary layers of $Al_yGa_{1-y}As_{1-z}P_z$ grown on $Al_xGa_{1-x}As$ substrates ($y > x \geq 0$). By carefully controlling the quaternary layer thickness and the lattice parameter mismatch at the growth temperature, it is possible to change the direction of substrate dislocations as they enter the substrate/layer interface. The length of the dislocation in the interfacial plane can be extended so that it is "infinitely" long, i.e., it reaches the edge of the wafer. As a result, the epitaxial quaternary layer and all layers subsequently grown thereon will be virtually dislocation free, provided that the thickness, stress and uniformity of the layers are such that no surface dislocation souces are activated. Also described are double heterostructure junction lasers with reduced values of both stress and dislocations.

11 Claims, 10 Drawing Figures

REDUCTION OF DISLOCATIONS IN MULTILAYER STRUCTURES OF ZINC-BLEND MATERIALS

CROSS REFERENCE TO RELATED APPLICATIONS

This application is a continuation-in-part of application Ser. No. 414,674 now abandoned filed on Nov. 12, 1973 and was filed concurrently with application Ser. No. 463871 entitled "Stress Reduction in AlGaAs-AlGaAsP Multilayer Structures". The latter application is a continuation-in-part of application Ser. No. 414,664 also filed on Nov. 12, 1973.

BACKGROUND OF THE INVENTION

This invention relates to the reduction of dislocations in semiconductor layers epitaxially grown on mismatched substrates and, more particularly, to double heterostructure junction lasers incorporating such layers.

In the summer of 1970 I. Hayashi and M. B. Panish reported successful c.w. operation at room temperature of a semiconductor p-n junction laser now known as the double heterostructure (DH) laser (*Applied Physics Letters*, Vol. 17, No. 3, pages 109–111, Aug. 1, 1970). This achievement was the result of intensive efforts both in physics, which led to the design of the DH laser, and in chemistry, which led to improved liquid phase epitaxy (LPE) techniques for realizing the DH laser.

Briefly, the DH laser comprises a narrow bandgap active region which may be either n-type, p-type or may contain a p-n junction in which case it has both conductivity types. The active region is sandwiched between relatively wider bandgap, opposite-conductivity-type layers which form two heterojunctions, one at each interface with the active region. These heterojunctions, as is now well known, serve to confine injected carriers as well as stimulated radiation to the active region. Consequently, it was early recognized by Hayashi and Panish that the heterojunctions should have as few defects as possible because such defects could act as nonradiative recombination centers which would tend to reduce efficiency and increase lasing thresholds. They, therefore, fabricated their DH lasers by LPE from the GaAs-AlAs semiconductor system; i.e., early forms of the DH lasers comprised an n-GaAs substrate on which were grown the following layers: n-$Al_xGa_{1-x}As$, p-GaAs (the active region) and p-$Al_xGa_{1-x}As$. Because GaAs and AlAs are nearly lattice matched at the growth temperature (about 800° C), GaAs and AlGaAs were even better lattice matched, so that particularly good heterojunctions were formed during LPE fabrication.

When operated c.w. at room temperature, however, these early forms of the DH laser typically had relatively short lifetimes ranging from only a few minutes to tens of hours. Consequently, systematic studies of DH lasers were undertaken in order to identify degradation mechanisms and to develop solutions to the short lifetime problem.

For example, R. L. Hartman and A. R. Hartman have shown that the reduction of process-induced stress (e.g., stress due to bonding of contacts) increases the lifetime of DH lasers (see *Applied Physics Letters*, Vol. 23, p. 147 (1973)). Panish and Rozgonyi have suggested that the reduction of growth-induced stress may further extend the lifetime (see the concurrently filed application, Case 11-6, supra). More particularly, the latter application teaches that although GaAs and AlAs are nearly lattice matched at the LPE growth temperature, their lattice mismatch is magnified at room temperature (where the lasers are intended to operate) because of the different thermal expansion coefficients of the two materials. Therefore, at room temperature there is considerable stress in the grown epitaxial layers.

Panish and Rozgonyi propose that the process be reversed; i.e., that a slight lattice mismatch be intentionally introduced at the growth temperature so that the difference in thermal expansion, before a deleterious factor, can be taken advantage of to produce a better lattice match at room temperature where DH lasers are most often operated. They teach that the average stress at room temperature between contiguous layers of $Al_xGa_{1-x}As$ and $Al_yGa_{1-y}As$ ($0 \leq x, y \leq 1$; $y > x$) can be reduced by the addition of small, controlled amounts of phosphorus during the growth of the latter layer so that the quaternary $Al_yGa_{1-y}As_{1-z}P_z$ is grown instead of the ternary $Al_yGa_{1-y}As$. They have found that the amount of phosphorus added must be properly chosen: too little added may reduce stress by only a minimal amount whereas too much added may in fact increase stress and may generate dislocations. In particular, they teach that in order to reduce the average stress at room temperature to less than about $2 \times 10^8$ dynes/cm² the amount of phosphorus added should satisfy the condition:

$$0.03 \leq z/(y-x) \leq 0.05, \qquad (1)$$

and to reduce the average stress to substantially zero the following condition should be satisfied:

$$z/(y-x) = \approx 0.04. \qquad (2)$$

However, growth with reduced strain does not necessarily eliminate substrate dislocations which extend into the quaternary layer. Such dislocations can expand to the point where the operation of a junction laser will terminate (see *Applied Physics Letters*, Vol. 23, p. 469 (Oct. 15, 1973) by P. M. Petroff and R. L. Hartman).

SUMMARY OF THE INVENTION

We have developed a procedure which prevents defects in a substrate of a material having a zinc-blende crystallographic structure from extending into zinc-blende layers formed thereon. In particular our procedure virtually eliminates dislocations in quaternary layers of AlGaAsP grown on AlGaAs or GaAs substrates. By carefully controlling the layer thickness and the lattice parameter mismatch at the growth temperature, it is possible to change the direction of substrate dislocations as they enter the substrate/layer interface. The length of the dislocation in the interfacial plane can be extended such that it is "infinitely" long, i.e., it reaches the edge of the wafer. As a result, the epitaxial quaternary layer and all layers subsequently grown thereon will be virtually dislocation free, provided that the thickness, stress and uniformity of the layers are such that no surface dislocation sources are activated. More particularly, the quaternary layer thickness should be in the approximate range of 1 μm to 3 μm when the fraction of phosphorus in the quaternary layers is in the range of about 0.03 to 0.007. In addition, if stress reduction is desired condition (1) above should be satisfied, as taught in the concurrently filed application of Panish and Rozgonyi, Ser. No. 463,871, supra. A unique characteristic of the dislocation behavior in this system is the occurrence of a unidirectional glide of those dislocation segments which are originally in the quaternary layer and are subsequently removed when the interfacial misfit dislocations reach the edge of the wafer.

At times we will use for convenience the abbreviations AlGaAs and AlGaAsP to represent, respectively, the ternary compound, aluminum gallium arsenide and the quaternary compound, aluminum gallium arsenide phosphide.

BRIEF DESCRIPTION OF THE DRAWING

Our invention, together with its various features and advantages, can be easily understood from the following more detailed description taken in conjunction with the accompanying drawing, in which.

DETAILED DESCRIPTION

Figure 1A:
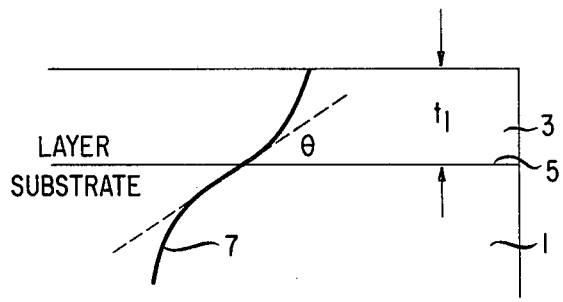
FIG. 1 is a schematic diagram of a substrate dislocation which has grown into a layer and which, as a function of layer thickness, bows (FIG. 1A), glides (FIG. 1B) and reaches the edge of the sample (FIG. 1C)
Figure 1B:
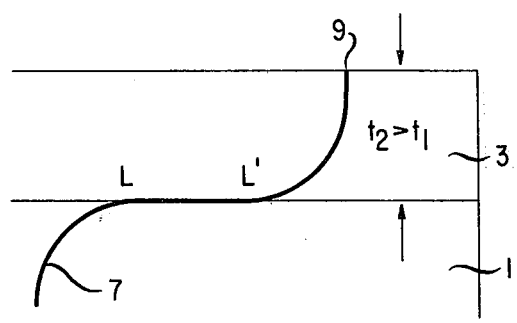
Figure 1C:
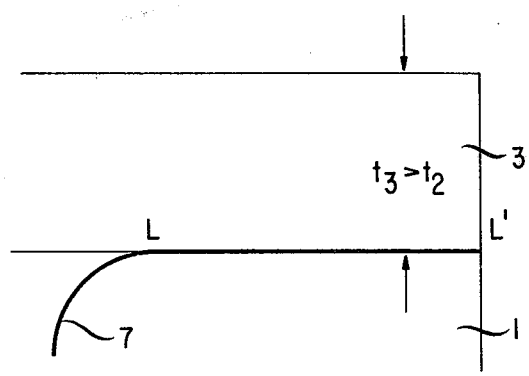

In accordance with one aspect of our invention, the direction of dislocations, which would normally propagate from a substrate into an epitaxial layer, can be changed so that the defect does not pass through the layer. The driving force for effecting this change is the strain energy that exists during growth at a misfit interface between the epitaxial layer and the substrate. To understand better this phenomenon, consider FIG. 1 which shows schematically the effect of interfacial strains on a substrate dislocation 7 which has grown from the substrate 1 into a layer 3 of thickness $t_1$, e.g., a layer of $Al_yGa_{1-y}As_{1-z}P_z$ grown on an $Al_xGa_{1-x}As$ substrate ($y > x \geq 0$). As long as the strain is elastically accommodated, the substrate/layer interface 5 will be coherent and the only effect on the dislocation will be a slight bowing as shown in FIG. 1A. However, as the thickness of the layer increases to $t_2 > t_1$, the angle $\theta$ between the dislocation and the substrate/layer interface will decrease. Eventually, $\theta = 0$ and the dislocation moves to the right, as shown in FIG. 1B, thereby creating an incoherent interface with a length LL' of misfit dislocation line. At this stage the bowed segment of the dislocation will still exit from the sample at the top surface of the layer 3 as shown at 9. We have found that by adjusting the stress level in the layer 3 during growth of that layer, it is possible for the segment of dislocation in the layer to glide to the edge of the wafer, as shown in FIG. 1C, thereby eliminating that defect from the bulk of the layer 3 and relieving part of the elastic misfit strain.

An experimental verification of this model has been obtained by growing liquid phase epitaxial layers (LPE) of $Al_yGa_{1-y}P_z$, with $y \approx 0.34$ and $z \leq 0.05$, on GaAs substrates, as described in the concurrently filed application of Panish and Rozgonyi, Case 11-6, supra, which teaches that the lattice mismatch and room temperature stresses can be accurately controlled by varying $z$. In contrast, we control the stress in the layer 3 at the growth temperature by careful adjustments of both the lattice parameter and the layer thickness.

The rationale behind these requirements can be understood from the following discussion. Mathematically the misfit induced elastic force, $F_\epsilon$, acting on a dislocation can be expressed as $$F_\epsilon = Ktf \qquad (3)$$

where $t$ is the layer thickness, $f$ is the layer/substrate lattice misfit, and $K$ is proportional to $b$, the Burgers' dislocation vector, and the elastic constants of the layer material. The dislocation during its motion is still subjected to forces such as its line tension, surface image forces and Peierls forces, however, the control of $F_\epsilon$ in the $Al_yGa_{1-y}As_{1-z}P_z/GaAs$ system is such that it is possible to introduce misfit dislocations and vary their density from $10^2$ to $10^8/cm^2$ by adjusting $t$ and/or $f$.

In the course of our investigations we found that the model described in FIG. 1 was accurate and could be experimentally verified. For example, the initial stages of glide of a substrate dislocation are shown in the X-ray topographs (XRTs) of an AlGaAsP/GaAs sample shown in FIGS. 2A and 2B. The arrows A, B, C point to misfit dislocations which lie in the substrate/layer interface and are aligned along the [110] direction. In each case the source of these three defects is a substrate dislocation, see arrow B' in FIG. 2A, and arrows A' and C' in FIG. 2B. Two photographs corresponding to different diffraction conditions were used to image the substrate dislocations. Although the misfit dislocations are not in strong contrast in FIG. 2B, the correlation with dislocations threading through the substrate was readily made because of the residual contrast of the misfit defects, which are 60° type dislocations with <110> Burgers' vectors inclined at 45° to the interface plane. Also shown in FIG. 2B, see arrows S, are two examples of the short segments of dislocations which traverse the thickness of the AlGaAsP layer and emerge on the top surface of the sample. These segments, acutally black and white dots, are associated with the two longer misfit dislocations which appear in strong contrast and are vertically oriented in the left-hand side of FIG. 2A. Using transmission electron microscopy (TEM), the same phenomenon has been observed at much higher magnification in FIG. 3, see arrow D', which shows a threading substrate dislocation transformed into an interfacial misfit dislocation, see arrow D. Dislocations D, E, F, and G are very long and form a unidirectional, coplanar array. The significance of the unidirectional character of the misfit dislocations will be discussed in detail below.

Figure 2A:
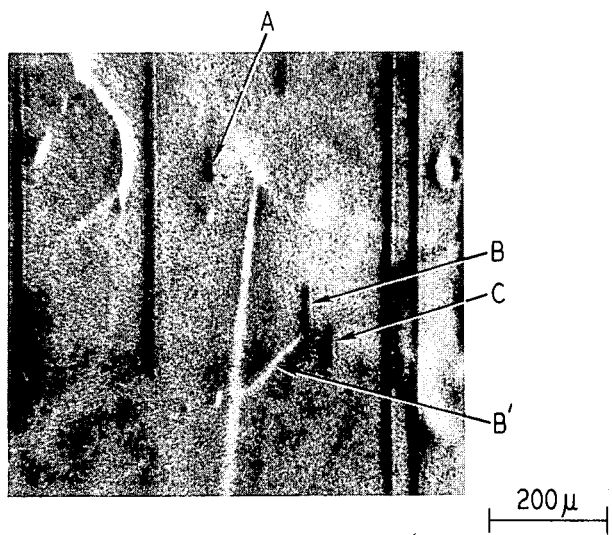
FIGS. 2A and 2B are transmission X-ray topographs (XRTs) of AlGaAsP/GaAs samples with a relatively low density of misfit dislocations.
Figure 2B:
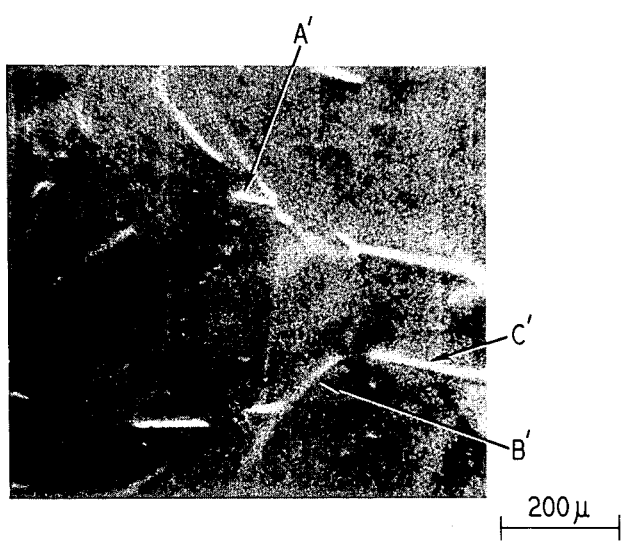
Figure 3:
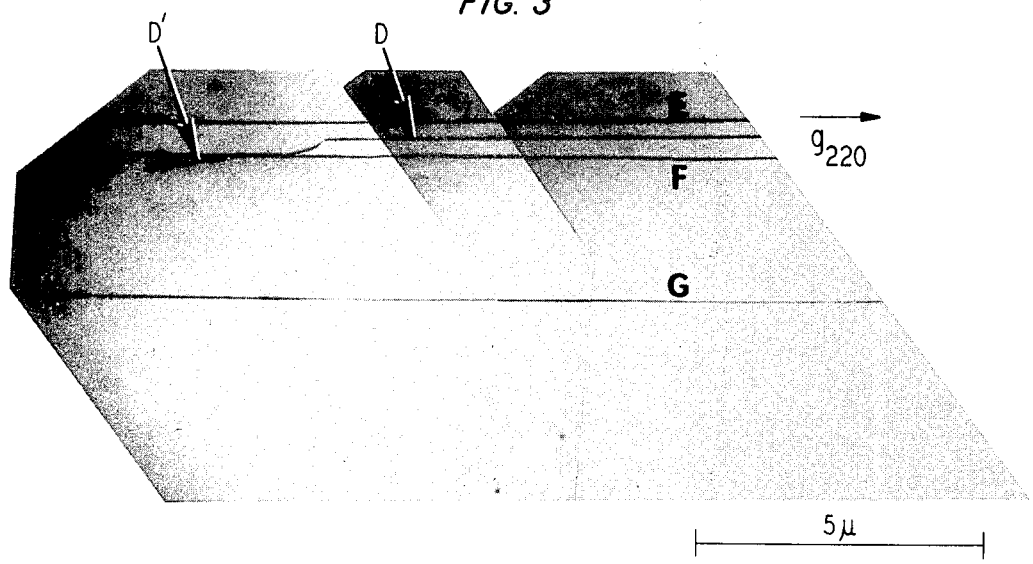
FIG. 3 is a bright field transmission electron micrograph (TEM) of a [001] AlGaAsP/GaAs interface with a relatively high density of misfit dislocations (e.g., at D) and a substrate dislocation indicated at D'.
Figure 4A:
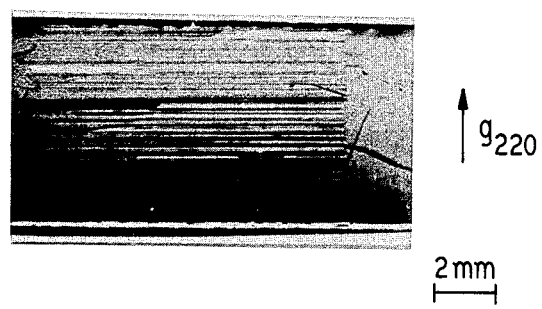
FIGS. 4A and 4B are XRTs of AlGaAsP/GaAs samples showing respectively, a unidirectional array of "infinitely" long misfit dislocations, and a low density of cross-grid misfit dislocations as indicated by the arrows cg.
Figure 4B:
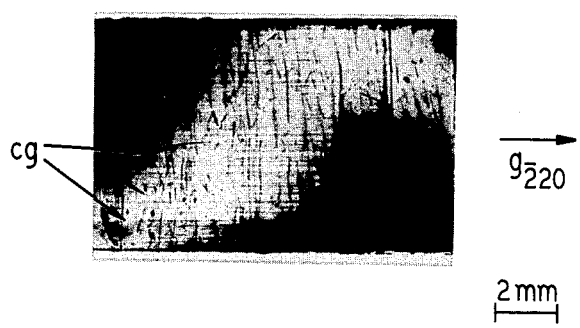

Although the schematic in FIG. 1B and the XRT examples in FIGS. 2A and 2B depict misfit lengths which are finite, we found that the dislocations are swept to the edge of the wafer if the force $F_\epsilon$ is sufficiently large. In practice we have found that a unidirectional array occurs if the quaternary layer thickness is in the range of about 1 μm to 3 μm when the fraction $z$ of phosphorus in the quaternary layer is in the range of about 0.03 to 0.007. An example of a unidirectional array of "infinitely" long misfit dislocations, which extended to the boundaries of an AlGaAsP layer, is shown in the XRT of FIG. 4A. This sample had a misfit dislocation density greater than $10^7$ cm$^{-2}$, which is beyond the resolving capabilities of the XRT technique. Therefore, TEM analysis was used to confirm that none of the defects emerged from the top surface of the layer. Also an XRT of the same sample obtained under a diffraction condition that suppressed the misfit defect contrast, see FIG. 4B, did not reveal the black/-white dots typically associated with misfit dislocations of finite length, recall arrows S in FIG. 2B. The overwhelming unidirectional nature of the misfit dislocations is also evident by comparing FIGS. 4A and 4B. In FIG. 4B the substrate dislocations were not absolutely straight and their density and general appearance were determined from the right-hand edge of the wafer where no AlGaAsP layer was grown on the substrate. The much higher density of misfit dislocations in the sample of FIG. 4 relative to the substrate dislocation count was also confirmed by TEM analysis and was found to be due to the multiplication of misfit dislocations as they glide out to the edge of the wafer. This multiplication results in an interfacial dislocation density which can be orders of magnitude higher than the substrate dislocation density. However, as long as the misfit array was unidirectional and its density was greater than about $10^5$ cm$^{-2}$, there was no evidence of any inclined or threading dislocations which could be traced to substrate dislocations. It must be noted that there are present in FIG. 4B short lengths of about 20 misfit dislocations which are orthogonal to the original array, see arrows $cg$. These defects (hereafter called the cross-grid array) were quite different from those in the original array in that they did not appear to originate at a substrate threading dislocation or at a misfit dislocation which had cross-slipped. That is, both ends of the interfacial defect exited from the top surface of the layer. Therefore, these dislocations must have nucleated at the epi-layer surface, expanded down to the substrate/layer interface and then glided out to form a length of misfit dislocation.

The fact that the cross-grid array forms after the substrate dislocations have been swept out by the original misfit array is significant because the formation of a unidirectional array of misfit dislocations requires that a moving dislocation not be pinned by interaction with other dislocations before it glides out of the crystal. It is therefore important that the formation of a cross-grid of misfit dislocations be suppressed if dislocation-free epitaxial quaternary layers are desired.

The formation of the unidirectional and cross-grid arrays is dependent upon both the quaternary layer thickness and its phosphorus composition. The relationship between these parameters and the formation of misfit dislocations is best understood with reference to FIG. 6, a graph of the fraction $z$ of P in an $Al_{0.34}Ga_{0.66}As_{1-z}P_z$ layer grown on a GaAs substrate versus the thickness $t$ of the layer. The threshold curve shown divides the graph into two zones: the generally lower-left-hand portion of $(z,t)$ points for which no misfit dislocations are created at the substrate/layer interface, and the generally upper-right-hand portion of $(z,t)$ points for which a cross-grid array is generated at the interface. The boundary between these two zones, the threshold curve, represents those $(z,t)$ points for which a undirectional array of misfit dislocations is formed at the interface. As mentioned previously, a unidirectional array prevents defects in the substrate from propagating or extending into the quaternary layer. In the specific range of quaternary layer thicknesses from 1 to 3 μm, the corresponding range of $z$ which generates a unidirectional array is about 0.0283 to 0.0072, or within experimental error $z$ ranges between 0.03 to 0.007.

Figure 6:
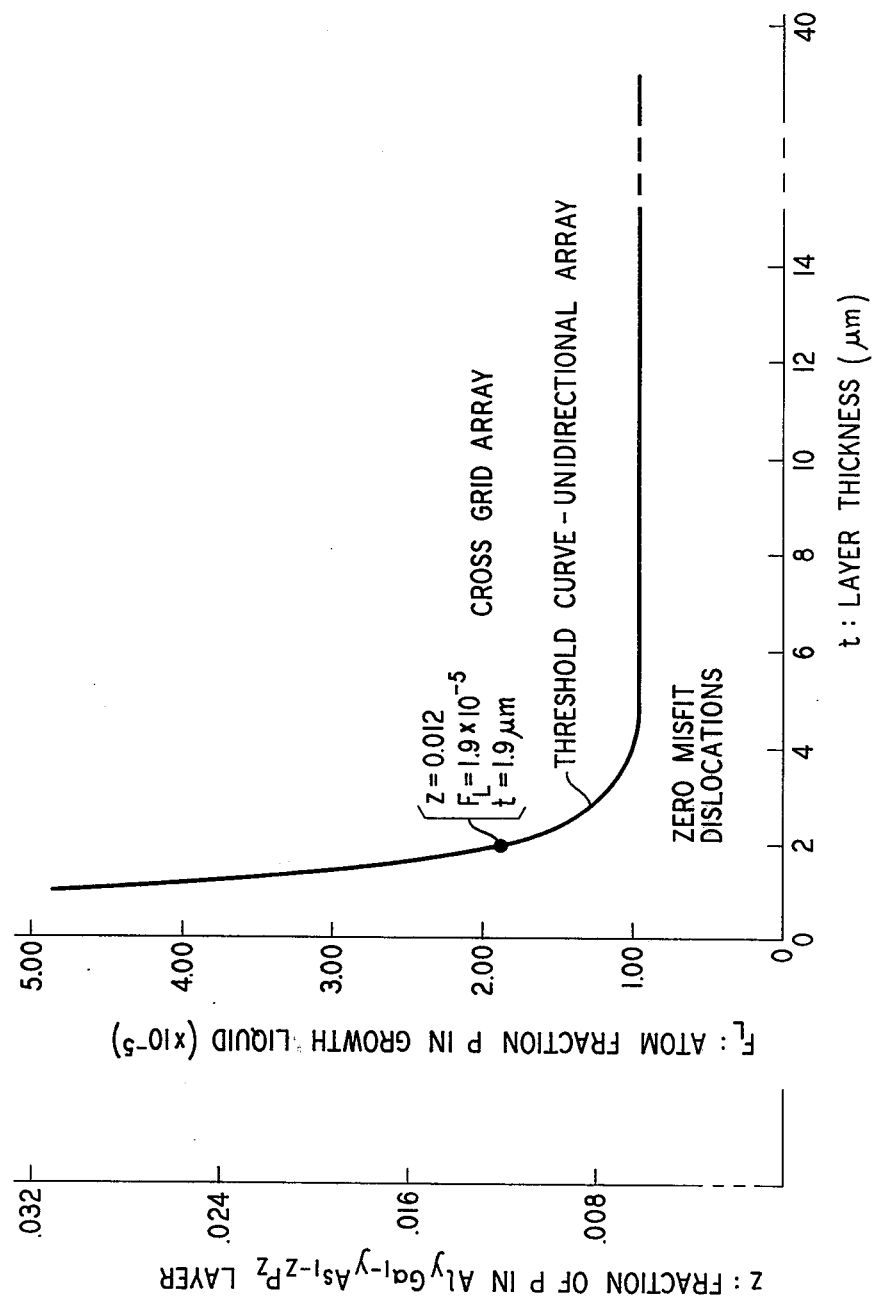
FIG. 6 is a graph showing the fraction $z$ of phosphorus in the $Al_yGa_{1-y}As_{1-z}P_z$ quaternary layer (as well as the atom fraction $F_L$ of phosphorus in the quaternary growth solution) versus the quaternary layer thickness.

Several comments regarding FIG. 6 are in order. First, although our experimental measurements were performed by growing quaternary $Al_yGa_{1-y}As_{1-z}P_z$ layers with an aluminum composition $y = 0.34$, we believe the threshold curve is valid over a broad range of values of $y$ because at the LPE growth temperature (about 800° C), where misfit defects and dislocations would be generated, the lattice parameter difference between $Al_yGa_{1-y}As$ and GaAs, for a broad range of composition up to $y = 0.8$, is small relative to the mismatch created when phosphorus is added to AlGaAs. Secondly, although the threshold curve is shown to be a single line, it should be understood that difficulty in making thickness measurements, as well as thickness inhomogeneities in the LPE grown layers, produces a degree of uncertainty in the thickness parameter. Thus, for example, a quaternary layer having a phosphorus composition given by $z \approx 0.012$ (corresponding to an atom fraction $F_L$ of about $1.9 \times 10^{-5}$ in the liquid) should nominally be 1.9 μm thick to produce a unidirectional array at the growth interface. However, when the above-mentioned variations are taken into account, the actual thickness could be anywhere in the range of $1.9 \pm 0.3$ μm. Thirdly, two ordinates are provided: one for the atom fraction $F_L$ of phosphorus in the growth liquid (a gallium solution of Ga, Al, As, P and typically a dopant) and the other for the fraction $z$ of phosphorus in the quaternary layer. A value of the phosphorus distribution coefficient of about 300, which was independently determined by Auger electron spectroscopy, has been used to calculate $z$ from the atom fraction $F_L$ of phosphorus in the growth solutions.

The underlying mechanism which controls the formation of a unidirectional array is not well understood from a theoretical standpoint at this time. However, we theorize as follows without intending to limit the scope of our invention thereby. Since most of the substrate dislocations are of the 60° type, it would appear that statistically for a (100) substrate, an isotropic stress field applied to such dislocations will produce glide equally on the four (111) planes which intersect the (100) wafer surface. Our experimental observations, however, indicate that either the stress field is not isotropic or the threshold for the formation of misfit dislocations is lower for substrate defects lying on one set of (111) planes than it is on the other. The latter situation could be related to the asymmetric behavior of like-sign, 60° dislocations previously observed by Abrahams et al on cross-grid arrays in mixed III–V layers grown by vapor phase epitaxy (see, *Applied Physics Letters* Vol. 21, p. 185 (1972)). The asymmetric behavior of the misfit dislocations was also evident in our samples once a cross-grid array had been established. It is also possible that nonuniformities in the epi-layer thickness or misorientation of the wafer surface could lead to an asymmetric stress situation.

Since the formation of misfit dislocations relieves the elastic stress in the layer, there should be a corresponding asymmetric relaxation of the bending force on the substrate when a unidirectional misfit array is generated. Such relaxation has been confirmed on a (001) oriented wafer by independently measuring the substrate radius of curvature in the [110] and [$\bar{1}$10] to directions. Using an X-ray lattice curvature technique described by G. A. Rozgonyi et al in *Review of Science Instruments*, Vol. 44, p. 1053 (1973), we have found that the radius of curvature was the same, typically about 20 meters, in both the [110] and [$\bar{1}$10] directions for an elastically accommodated layer with no misfit dislocations. The radius of curvature was larger, on the order of 100 meters, in the direction orthogonal to a unidirectional misfit dislocation array; and it increased to values larger than 100 meters in both directions for a fully developed cross-grid network.

Returning to the behavior of threading substrate dislocations on the Ga or As-rich (111) planes, we invoked a cross-slip mechanism to account for the elimination of all substrate defects with a unidirectional array of misfit dislocations. Otherwise, the cross-grid misfit dislocations would be associated with substrate, and not surface sources. Our TEM observations indicated that cross-slip of 60° type dislocation in these films was extremely common, probably due to the strong screw component of these dislocations. Further experimental evidence of the importance of the cross-slip mechanism was obtained by TEM studies of a sample composed of four epitaxial layers. The sample structure comprised the following: on a (001) GaAs substrate a layer (1) of AlGaAsP was grown, a second layer (2) of GaAs, a third layer (3) of AlGaAsP and a fourth layer (4) of GaAs were then added. The thicknesses and composition of these layers were such that a unidirectional array of misfit dislocations was formed at the interface between the substrate and layer (1). No threading or inclined dislocations were observed in layers (1), (2), (3) or (4). This observation gave clear support to the idea that the easy cross-slip of "60° type" dislocation and a small stress anisotropy or asymmetric misfit dislocation behavior can lead to the formation of the unidirectional array.

In summary, we have found that the deliberate introduction of the proper lattice misfit at the growth temperature, along with suitable layer thickness control, in the AlGaAsP/GaAs heterojunction system virtually eliminates dislocations from the epitaxial AlGaAsP layer. The procedure depends on controlling the stresses in the layer so that only a unidirectional array of misfit dislocations is operating and so that surface sources are not activated. Since there are two independent variables: ($i$) the lattice mismatch, which is controlled by the phosphorus concentration and ($ii$) the layer thickness, it is now possible to fabricate double heterostructure lasers with both reduced from temperature stresses and virtually dislocation free active layers.

Figure 5:
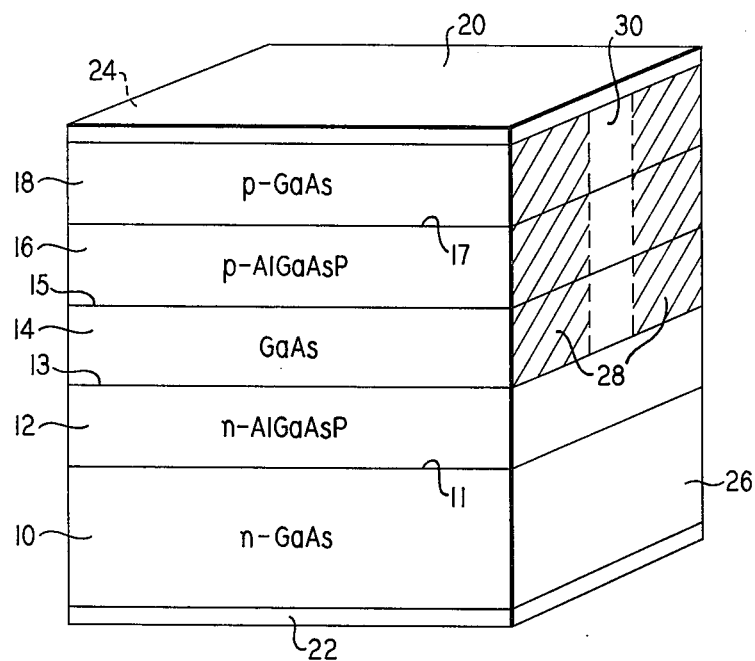
FIG. 5 is a schematic drawing of a DH laser in accordance with an illustrative embodiment of our invention.

Application of the foregoing stress and dislocation reduction procedures to the LPE growth of double heterostructure lasers has resulted in significant and reproducible reductions in the threshold current density for lasing and in the virtual elimination of dislocations in the LPE layers of the laser structures. As shown in FIG. 5, a DH laser in accordance with an illustrative embodiment of our invention comprises an n-GaAs substrate 10 on which are grown by LPE the following layers in the order recited: an n-Al$_y$Ga$_{1-y}$As$_{1-z}$P$_z$ layer 12; an n-type, p-type or compensated GaAs layer 14; a p-Al$_q$Ga$_{1-q}$As$_{1-p}$P$_p$ layer 16 and a p-GaAs layer 18. In general, of course, layer 14 may also include Al or Al and P and the conductivity types of the layers may be reversed if a p-type substrate is used. As is well known in the art, however, the fraction of Al added to layer 14 should be less than about 0.4, the point at which AlGaAs changes from a direct gap to an indirect gap semiconductor.

Layers 12, 14, and 16 comprise a double heterostructure and the interfaces 13 and 15 therebetween form a pair of heterojunctions which serve to confine both light and injected carriers to the active region (layer 14) when the device is forward biased. Typically the heterostructure forms a symmetric waveguide in which case $y = q$ and $z = p$. Layer 18 is utilized to make good electrical contact to the device and usually includes a thin (0.2 $\mu$m) high conductivity surface layer (not shown) formed by diffusing Zn therein. Electrical contacts 20 and 22 are deposited, or otherwise formed, on layer 18 and substrate 10, respectively. A resonator is formed by mirrors 24 and 26 which are typically cleavage faces of the GaAs crystal. One or more heat sinks (not shown) may be thermally coupled to either the substrate 10 or the top layer 18 by means well known in the art.

In one embodiment a stripe contact geometry is defined by bombarding the spatially separate zones 28 with high energy protons along the length of device and approximately to the depth of heterojunction 13. As described in copending U.S. application Ser. No. 204,222 filed on Dec. 2, 1971, now U.S. Pat. No. 3,824,133 issued on July 16, 1974, such proton bombardment produces high resistivity in zones 28 which serve to confine the electrical current applied through contact 20 to the unbombarded zone 30 (about 13 $\mu$m wide). In addition, this configuration tends to confine the laser radiation to oscillation in the fundamental transverse mode parallel to the plane of the heterojunctions. We have also constructed, however, broad-area-contact lasers in which no proton bombardment was performed and, therefore, the laser was pumped across its entire width and length.

For the case of a nearly symmetric structure, numerous lasers of the type shown in FIG. 5 were fabricated by utilizing phosphorus compositions rangind from about 30 to 150 $\mu$gm GaP per 4 gm Ga in the growth solutions of AlGaAsP layers 12 and 16. The layers were grown by LPE at about 780° C with a cooling rate of 0.1° C/min. The corresponding fraction $z$ of phosphorus, derived from approximate calculations, ranged from about 0.004 to 0.02 whereas the fraction ($y = q$) of aluminum was about 0.24. For different devices the thickness $d$ of the active region (layer 14) ranged from about 0.15 $\mu$m. Within this range the thresholds for quaternary lasers were about 25 percent lower than those of ternary lasers.

In an illustrative example of the DH laser of FIG. 5, the substrate 10 comprised n-GaAs doped with Si to 3 $\times 10^{18}$/cm$^3$, and layer 12 was 1.8 $\mu$m thick and comprised n-Al$_{0.24}$Ga$_{0.76}$As$_{0.99}$P$_{0.01}$ doped with Te to 2.5 $\times 10^{17}$/cm$^3$. More accurately, $z = 0.012$ in layer 12 inasmuch as the growth solution for that layer contained about 105 $\mu$gm GaP per 4 gm Ga. Thus, the ratio $z/(y-x)$ for $z = 0.012$, $y = 0.24$ and $x = 0$ is about 0.05, within the range of inequality (1). Layer 14 was about 0.2 μm thick and comprised p-GaAs doped with Ge to $4 \times 10^{17}/cm^3$, layer 16 was about 0.5 μm thick and comprised p-$Al_{0.24}Ga_{0.76}As_{1-p}P_p$ ($p = z$ approximately) doped with Ge to $3.3 \times 10^{17}/cm^3$, and layer 18 was about 1.9 μm thick and comprised p-GaAs doped with Ge to $2 \times 10^{18}/cm^3$. In addition, the resonator length was about 380 μm.

Inasmuch as the layer 12 was fabricated from a growth solution containing 105 μgm GaP per 4 gm Ga, the atom fraction $F_L$ of phosphorus in the solution was about $1.9 \times 10^{-5}$ which corresponds to $z$ in the solid of about 0.012. Using FIG. 6 the thickness of layer 12 should therefore be about 1.9 μm, or within experimental error $1.9 \pm 0.3$ μm. Inasmuch as layer 12 was nominally 1.8 μm thick, within the prescribed range, a unidirectional array of misfit dislocations formed at interface 11 between layer 12 and substrate 10. This array we expect is effective not only as a barrier against dislocations introduced during LPE growth, but also against dislocations introduced below interface 11 by subsequent processing steps, e.g., cleaving or polishing. Such dislocations, therefore, should not penetrate into the active region (layer 14) of the laser.

It is to be understood that the above-described arrangements are merely illustrative of the many possible specific embodiments which can be devised to represent application of the principles of our invention. Numerous and varied other arrangements can be devised in accordance with these principles by those skilled in the art without departing from the spirit and scope of the invention. In particular, the structures and techniques described herein find application in numerous other devices such as single heterostructure lasers and heterostructure LEDs of the type described by I. Hayashi in application Ser. No. 307,219 now U.S. Pat. No. 3,801,928 issued on Apr. 2, 1974, and application Ser. No. 307,377 now U.S. Pat. No. 3,812,516 issued on May 21, 1974, concurrently filed with one another on Nov. 17, 1972. Use is also contemplated in non-optical devices where it is desired to reduce stress or misfit dislocations.

Moreover, our invention can in principle, be applied to other materials which have the following characteristic: a zinc-blende structure, an amenability to composition and thickness control, and the ability to exhibit misfit dislocations at the substrate interface. Provided that the substrate dislocation density (SDD) is not too large, less than or equal to about $10^5/cm^2$, the composition and thickness parameters of the epitaxial layer can be controlled to generate a unidirectional array of misfit dislocations before a cross-grid array forms. The SDD is a parameter one specifies to substrate manufacturers and is nominally $10^3/cm^2$ for GaAs, for example. However, we have demonstrated that unidirectional arrays can be controllably generated even when the SDD exceeded $10^4/cm^2$.

What is claimed is:

1. A semiconductor device comprising
   a first layer of a material having a zinc-blende crystallographic structure and exhibiting a non-zero dislocation density,
   a second layer of a material having a zinc-blende crystallographic structure formed on said first layer so that misfit dislocations are generated at the interface between said layers,
   the thickness and composition of said second layer being effective to generate a unidirectional array of misfit dislocations at said interface which virtually prevents any defects in said first layer from extending into said second layer.

2. The structure of claim 1 wherein
   said first layer comprises $Al_xGa_{1-x}As$,
   said second layer comprises $Al_yGa_{1-y}As_{1-z}P_z$, and
   the fraction $y$ of Al in said second layer exceeds the fraction $x$ of Al in said first layer.

3. The structure of claim 2 wherein the thickness of said second layer is in the approximate range of 1 μm to 3 μm and the fraction $z$ of phosphorus is in the range of about 0.03 to 0.007.

4. The structure of claim 3 wherein said second layer is epitaxially grown from a gallium solution containing about 1 to $5 \times 10^{-5}$ atom percent phosphorus.

5. A double heterostructure light emitting device including:
   a GaAs substrate comprising said first layer of claim 2,
   a first wide bandgap layer comprising said $Al_yGa_{1-y}As_{1-z}P_z$ layer of claim 2,
   an active layer comprising $Al_pGa_{1-p}As$, $0 \leq p < y$, formed on said first wide bandgap layer, and
   a second wide bandgap layer comprising $Al_qGa_{1-q}As_{1-m}P_m$, $q > p$, formed on said active layer.

6. The device of claim 5 wherein $p$ is substantially zero and said active layer comprises GaAs.

7. The device of claim 5 wherein said substrate is n-type, said $Al_yGa_{1-y}As_{1-z}P_z$ layer is n-type, and said $Al_qGa_{1-q}As_{1-m}P_m$ layer is p-type.

8. The device of claim 7 wherein said active layer is p-type.

9. The device of claim 8 including further a low resistivity contacting layer of p-GaAs formed on said $Al_qGa_{1-q}As_{1-m}P_m$ layer.

10. A semiconductor structure comprising
    a substrate of a material having a zinc-blende crystallographic structure and exhibiting a non-zero dislocation density,
    a device composed of a material having a zinc-blende crystallographic structure to be carried by said substrate, and
    means interposed between and contiguous with major surfaces of said substrate and said device for virtually preventing any defects in said substrate from extending into said device comprising a layer of material having a zinc-blende crystallographic structure, the composition and thickness of said layer being effective to generate a unidirectional array of misfit dislocations at the interface between said layer and said substrate.

11. A method of preventing defects in a zinc-blende substrate from extending into a zonc-blende epitaxial layer grown thereon comprising controlling the composition and thickness of said layer so that a unidirectional array of misfit dislocations is generated at the interface between said substrate and said layer.

* * * * *

UNITED STATES PATENT OFFICE
CERTIFICATE OF CORRECTION

Patent No. 3,962,716　　　　　　　　　Dated　June 8, 1976

Inventor(s) Pierre M. Petroff et al.

It is certified that error appears in the above-identified patent and that said Letters Patent are hereby corrected as shown below:

In the title "Zinc-Blend" should be spelled --Zinc-Blende--.

In the Abstract, line 2, "disclocations" should read --dislocations--.

Column 7, line 59, "from" should be --room--.
Column 8, line 58, after "0.15 µm" insert --to 0.40 µm--.
Claim 11, column 10, line 2, "zonc-blende" should be --zinc-blende--.

Signed and Sealed this

Twenty-third Day of November 1976

[SEAL]

Attest:

RUTH C. MASON
Attesting Officer

C. MARSHALL DANN
Commissioner of Patents and Trademarks